United States Patent
Sarma et al.

(10) Patent No.: US 7,759,856 B2
(45) Date of Patent: Jul. 20, 2010

(54) ORGANIC LIGHT EMITTING DIODE (OLED) HAVING IMPROVED STABILITY, LUMINANCE, AND EFFICIENCY

(75) Inventors: Kalluri R. Sarma, Mesa, AZ (US); Xiaowei Sun, Singapore (SG); Baijun Chen, Singapore (SG)

(73) Assignee: Honeywell International Inc., Morristown, NJ (US)

( * ) Notice: Subject to any disclaimer, the term of this patent is extended or adjusted under 35 U.S.C. 154(b) by 93 days.

(21) Appl. No.: 11/015,046

(22) Filed: Dec. 17, 2004

(65) Prior Publication Data

US 2006/0132026 A1    Jun. 22, 2006

(51) Int. Cl.
*H05B 33/04* (2006.01)
*H05B 33/10* (2006.01)

(52) U.S. Cl. ................... 313/504; 313/506

(58) Field of Classification Search ......... 313/498–512; 428/690
See application file for complete search history.

(56) References Cited

U.S. PATENT DOCUMENTS

| | | | |
|---|---|---|---|
| 5,853,905 A | 12/1998 | So et al. | |
| 5,907,160 A | 5/1999 | Wilson et al. | |
| 6,432,741 B1 | 8/2002 | Mueller et al. | |
| 6,509,109 B1 * | 1/2003 | Nakamura et al. | 428/690 |
| 6,603,149 B2 | 8/2003 | Budd et al. | |
| 6,605,904 B2 * | 8/2003 | Jenekhe et al. | 315/169.3 |
| 6,727,644 B2 | 4/2004 | Hatwar et al. | |
| 6,750,609 B2 | 6/2004 | Aziz et al. | |
| 6,774,392 B2 | 8/2004 | Humbs et al. | |
| 6,777,724 B2 * | 8/2004 | Duggal et al. | 257/184 |
| 6,790,538 B2 * | 9/2004 | Naito | 428/690 |
| 6,791,262 B2 | 9/2004 | Bachmann et al. | |
| 6,806,491 B2 | 10/2004 | Qiu et al. | |
| 6,853,147 B2 * | 2/2005 | Suh et al. | 315/169.3 |
| 2001/0017517 A1 * | 8/2001 | Yamazaki | 313/504 |
| 2002/0011782 A1 | 1/2002 | Lee et al. | |
| 2002/0153831 A1 | 10/2002 | Sakakura et al. | |
| 2004/0012331 A1 * | 1/2004 | Yamazaki et al. | 313/506 |
| 2004/0061438 A1 * | 4/2004 | Yamazaki et al. | 313/506 |
| 2004/0108810 A1 * | 6/2004 | Tsujimura et al. | 313/506 |

FOREIGN PATENT DOCUMENTS

EP    1 009 198 A1    6/2000

OTHER PUBLICATIONS

Diamond-like Carbon Films As Electron-Injection Layer In Organic Light Emitting Diodes [online]. K. Lmimouni, C. Legrand, C. Dufour, A. Chapoton, Apr. 23,2001 [retrieved on Nov. 16, 2004]. Retrieved from Internet: <URL:apl.aip.org/apl/copyright.jsp>.

(Continued)

*Primary Examiner*—Nimeshkumar D Patel
*Assistant Examiner*—Anne M Hines
(74) *Attorney, Agent, or Firm*—Ingrassia Fisher & Lorenz, P.C.

(57) ABSTRACT

An organic light emitting diode (OLED) includes a relatively thin diamond-like carbon (DLC) layer disposed between the anode and the hole transport layer to improve luminous efficiency and operating life time. The relatively thin DLC layer inhibits hole injection, which balances charge flow and improves efficiency, and increases the surface smoothness of the anode, which contributes to the increased operating life time.

26 Claims, 3 Drawing Sheets

OTHER PUBLICATIONS

Diamond-like Carbon Coating Centre [online ] [retrieved Nov. 18, 2004]. Retrieved from Internet: <URL:www.brunel.ac.uk/faculty/tech/systems/groups/dlcc/>.

Plasma-deposited Diamondlike Carbon And Related Materials [online]. A. Grill [retrieved on Nov. 18, 2004]. Retrieved from Internet: <URL:www.research.ibm.com/journal/rd/431/grill.html>.

PCT International Search Report PCT/US2005/045370, May 9, 2006.

Dong Won Han et al., Electron Injection Enhancement by Diamond-like Carbon Film in Organic Electroluminescence Devices, Thin Solid Films, 2002, pp. 190-194, 420-421, S.Korea.

* cited by examiner

ORGANIC LIGHT EMITTING DIODE (OLED) HAVING IMPROVED STABILITY, LUMINANCE, AND EFFICIENCY

FIELD OF THE INVENTION

The present invention generally relates to organic light emitting diodes (OLEDs) and, more particularly, to polymer based OLEDs (PLEDs) that include a layer of a diamond like carbon, which improves the stability, luminance, and efficiency relative to present OLEDs.

BACKGROUND

In recent years, organic light-emitting diodes (OLEDs) have become increasingly important. This is due, at least in part, to the technological potential for OLED use in numerous products including, for example, multi-color, self-luminous flat-panel displays. An OLED exhibits several advantages over other light emitting devices. Some of these advantages include its wide range color emission capability, relatively low-voltage (e.g., <3V) operational capability, high-efficiency with low-power consumption, wide-viewing angle, and high-contrast.

A typical OLED includes an anode, a cathode, and at least two organic material layers disposed between the anode and cathode. The anode in many OLEDs comprises a relatively high work function material, such as indium tin oxide (ITO), and the cathode typically comprises a relatively low work function material, such as calcium (Ca). One of the organic material layers in a typical OLED comprises a material having the ability to transport holes, and is thus typically referred to as a hole transport layer. Another organic material layer typically comprises a material having the ability to transport electrons, and is thus typically referred to as an electron transport layer. The electron transport layer may also function as the luminescent medium (or emissive layer). Alternatively, an additional emissive layer may be disposed between the hole transport layer and the electron transport layer. In either case, when the OLED is properly biased, the anode injects holes (positive charge carriers) into the hole transport layer, and the cathode injects electrons into the electron transport layer. The injected holes and electrons each migrate toward the oppositely charged electrode. When an electron and hole localize on the same molecule, a Frenkel exciton is formed, and visible light is emitted.

While OLEDs have already appeared in some commercial applications, such as displays for mobile phones and digital cameras, certain challenges still remain to resolve various issues that adversely impact device reliability, chromaticity, and luminous efficiencies. For example, the surface roughness of anodes that comprise certain materials, such as indium tin oxide (ITO), contributes to the formation of dark spots, degradation, and eventual failure of many current OLEDs. As such, a significant amount of effort has been expended to improve OLED performance by modifying the anode surface. Some examples of anode surface modification techniques that have been attempted include chemical treatment, UV ozone treatment, oxygen plasma treatment, and mechanical polishing and annealing. In addition to these surface treatments, various other approaches have been attempted to address the adverse impact associated with anode surface roughness. These other approaches include depositing a layer of material, such as CuPc, LiF, Platinum, $SiO_2$, metal oxide, or parylene, onto anode surface. Although such treatments and modifications may enhance hole injection from the ITO anode and improve the luminous efficiency of the OLED, these treatments and modifications do not sufficiently improve the life time of the OLED.

Hence, there is a need for an OLED that exhibits adequate performance, such as high luminous efficiency and long life time, so that OLEDs can be used in relatively high-demand applications. The present invention addresses at least this need.

BRIEF SUMMARY

The present invention provides OLEDs having improved stability, luminance, and efficiency. In one embodiment, and by way of example only, an organic light emitting diode includes an anode, a diamond-like carbon (DLC) layer, an organic hole transport layer, an organic emission layer, and a cathode. The DLC layer is disposed on the anode, and has a thickness that is less than about 10 nm. The organic hole transport layer is disposed on the DLC layer, the organic emission layer is disposed on the hole transport layer, and the cathode is disposed on the organic emission layer.

In another exemplary embodiment, an organic light emitting diode includes a substrate, an anode, a tetrahedral amorphous carbon (ta-C) layer, an organic hole transport layer, an organic emission layer, and a cathode. The anode is disposed on the substrate, the ta-C layer is disposed on the anode, the organic hole transport layer is disposed on the ta-C layer, the organic emission layer is disposed on the hole transport layer, and the cathode is disposed on the organic emission layer.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
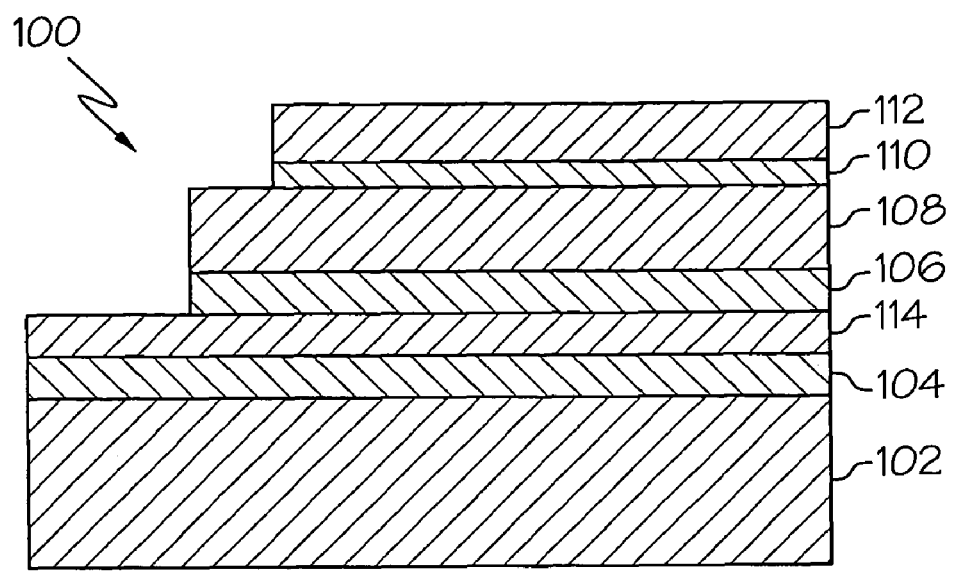
FIG. 1 is a simplified cross section view of an organic light emitting diode (OLED) according to an embodiment of the present invention.

Turning now to the description, and with reference first to FIG. 1, a simplified cross section view of an organic light emitting diode (OLED) according to an embodiment of the present invention is shown. The OLED 100 includes a substrate 102 having a plurality of different material layers deposited thereon. Included among these layers are an anode 104, an organic hole transport layer 106, an organic emission layer 108, and a cathode 110. The substrate 102 is preferably formed of glass, but it will be appreciated that it could be formed of other optically transparent or substantially translucent materials such as, for example, quartz, ceramic, transparent plastic, synthetic resin, or any one of numerous types of flexible transparent plastic substrates. Alternatively, the substrate 106 can be formed of an opaque material that is either rigid or flexible such as, for example, a flexible stainless steel foil. In this latter case, a top emission OLED architecture is used to extract the emitted light through a transparent cathode.

The anode 104 is disposed directly on the substrate 102 and functions, when connected to an appropriate voltage potential, to supply holes. In the depicted embodiment, the anode 104 comprises indium tin oxide (ITO) having a thickness of about 60 nm. It will be appreciated, however, that the anode 104 may comprise any one of numerous other anodic materials, now known or developed in the future. Other materials that could be used for the anode 104 include, for example, tin oxide doped with various metals, zinc oxide (ZnO), ZnO doped with various metals, gold, silver, palladium, silicon, electrically conductive carbon, π-conjugated polymers, such as polyaniline, polythiophene, polypyrrole, or various other electrically conductive anodic materials that are optically transparent, or at least sufficiently translucent, so that light emitted by the OLED 100 may be viewed. It will additionally be appreciated that the thickness of the specific material used for the anode 104 may be varied to achieve desired characteristics.

The organic hole transport layer (HTL) 106, as the name connotes, is an organic material that is readily able to transport the holes supplied by the anode 104. In the depicted embodiment, the organic hole transport layer 106 is polyethylene dioxy thiophene (PEDOT) having a thickness of about 20 nm, though it will be appreciated that numerous other organic materials, now known or developed in the future, and other layer thicknesses, could be used to achieve desired characteristics. For example, the hole transport layer 106 could also be formed of various other water-soluble polymer materials.

Figure 2:
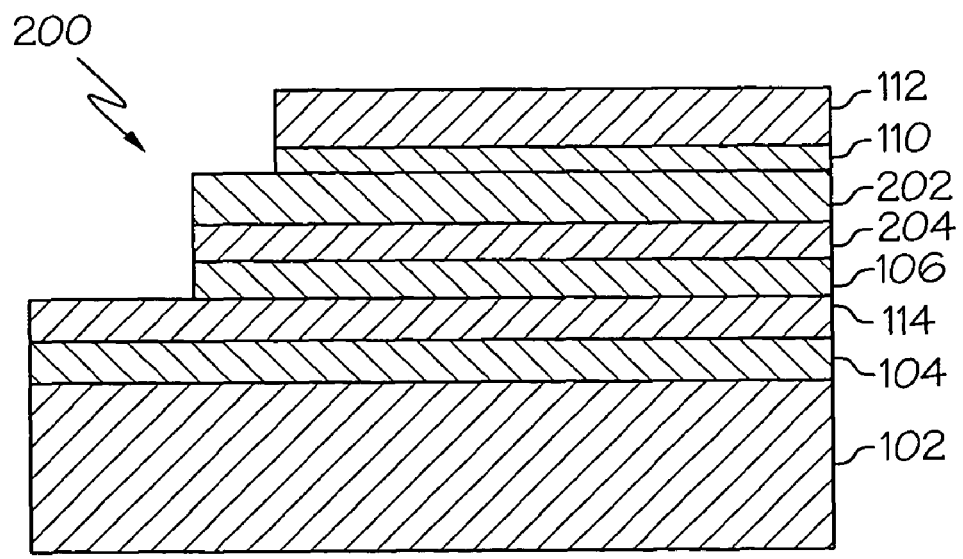
FIG. 2 is a simplified cross section view of an OLED according to an alternate embodiment of the present invention.

The organic emission layer (EL) 108, as its name connotes, functions to produce electroluminescent emission. However, in addition to this function the organic emission layer also functions as an electron transport layer, due to its ability to readily transport electrons. In the depicted embodiment, the organic emission layer 108 comprises poly (p-phenylen vynelene) (PPV) having a thickness of about 90 nm. However, it will be appreciated that the organic emission layer 108 may be any one of numerous organic materials, now known or developed in the future that exhibit electron transport and electroluminescent characteristics, and that the thickness of the emission layer 108 may vary to achieve desired characteristics. Some non-limiting examples of presently known suitable materials include polyfluorene (PFO) series materials. It will additionally be appreciated that in an alternate embodiment, which is shown in FIG. 2, the OLED 200 could include a separate organic electron transport layer 202 and a separate organic emission layer 204. In such an embodiment, the organic emission layer 204 is disposed between the organic hole transport layer 106 and the organic electron transport layer 202.

The cathode 110 is used to inject electrons into the organic emission layer 108, and preferably comprises a material having a relatively low work function. In the depicted embodiment, the cathode 110 comprises calcium (Ca) having a thickness of about 5 nm. It will be appreciated that this is merely exemplary, and that any one of numerous other suitable materials, now known or developed in the future, and other suitable cathode thicknesses, could also be utilized. Some examples of other suitable materials include, but are not limited to, indium, aluminum, barium, and magnesium, lithium, natrium, kalium or other alloy materials, such as Mg:Ag, Li:Al, Mg:Al, Ca:Ag, and Ca:Al, just to name a few. It will be appreciated that the specific material and thickness may be varied to achieve desired characteristics.

As FIGS. 1 and 2 additionally show, the OLED 100 may additionally include a protective layer 112, which is deposited on the cathode 110. The protective layer 112 may comprise any one of numerous types of materials. In the depicted embodiment, the protective layer 112 comprises silver (Ag) and has a thickness of about 200 nm. Other suitable materials that may be used as the protective layer 112 include, but are not limited to, Aluminum (Al), or alloy materials (Mg:Ag, Mg:Al, Ca:Ag) with high conductivity and reflectivity. It will be appreciated that the thickness of the protective layer 112 need not be 200 nm, but may vary to achieve desired characteristics. It will additionally be appreciated that in various alternate embodiments, the OLED 100, 200 may be implemented without the protective layer 112 altogether.

In addition to each of the above-described components that make up the depicted OLEDs 100, 200, the OLEDs 100, 200 further include a relatively thin layer of a diamond-like carbon (DLC) 114. The DLC layer 114 is disposed on the substrate between the anode 104 and the hole transport layer 106. Although various types of DLCs are known, a particular preferred type of DLC that is used is tetrahedral amorphous carbon (ta-C). As is generally known, tetrahedral amorphous carbon possesses a relatively high percentage (e.g., >80%) of $sp^3$ bonding. This relatively high $sp^3$ content results in ta-C exhibiting relatively high hardness, chemical inertness, and high electrical resistivity. The ta-C layer 114, when deposited as described in more detail further below, exhibits unique electronic, mechanical, and optical properties, is relatively smooth, and is substantially transparent to light having frequencies in the range of the visible light region to the infrared light region.

From the above description it is seen that the preferred OLED 100, as shown in FIG. 1, has the general configuration of anode/DLC/HTL/EL/cathode. As was further noted above, the specific materials and thicknesses of each of these material layers may vary; however, the specific OLED configuration that was used for investigative and comparative purposes is ITO (60 nm)/ta-C/PEDOT (20 nm)/PPV (90 nm)/Ca (5 nm)/Ag (200 nm). Using this specific configuration, five OLEDs 100, each having a different ta-C layer 114 thickness, were made and tested, and compared to an OLED made using the same method, but without a ta-C layer 114. A particular method by which each of these OLEDs is made will first be described, followed by a delineation of the test results.

A glass substrate 102 coated with a 60 nm thick layer of ITO 104, and having a sheet resistance of 50 Ω/square is first obtained. The ITO coated substrate is then cleaned using organic solvents, such as acetone and ethanol, preferably in an ultrasonic bath. The clean ITO coated substrate is then rinsed, preferably in de-ionized water, and then dried preferably using an inert gas, such as nitrogen. Thereafter, the ITO coated substrate may undergo an argon-plasma cleaning in a pre-chamber.

Once the ITO coated substrate is cleaned, the ta-C layer 114 is then deposited on the ITO 104. Preferably, the ta-C layer 114 is deposited, at room temperature, using a filtered cathodic vacuum arc (FCVA) deposition system. As is generally known, an FCVA deposition system uses a cathodic arc spot to emit a plasma beam, which may include various macro-particles and neutral atoms. Thus, the FCVA deposition system employs a magnetic filtering technique to remove unwanted macro-particles and neutral atoms. Specifically, the FCVA system generates a transverse magnetic field that filters out the unwanted macro-particles and neutral atoms, so that only ions within a well-defined energy range reach the ITO coated substrate.

As was alluded to above, ta-C layers 114 of five different thicknesses were deposited on five different ITO coated substrates. The ta-C layer thicknesses were 6.0 nm, 3.0 nm, 1.0 nm, 0.5 nm, and 0.3 nm. Following deposition to the desired layer thickness, the surface morphology and roughness of each ta-C layer 114 was determined using an atomic force microscopy (AFM) technique. The AFM images were obtained over an area of 1 μm×1 μm. For comparative purposes, an AFM image was also obtained over an area of 5 μm×5 μm for an ITO coated substrate with no ta-C deposited thereon. The surface roughness data for each of these examples is summarized in Table 1.

TABLE 1

| ta-C Thickness (nm) | Peak-to-peak Roughness (nm) | RMS Roughness (nm) | Mean Roughness (nm) |
|---|---|---|---|
| 6.0 | 14.565 | 1.644 | 1.260 |
| 3.0 | 10.993 | 1.313 | 1.043 |
| 1.0 | 6.685 | 0.722 | 0.536 |
| 0.5 | 8.911 | 0.978 | 0.724 |
| 0.3 | 19.101 | 1.542 | 1.139 |
| 0.0 | 26.858 | 1.873 | 1.68 |

Following deposition of the ta-C layer 114 to the desired thickness, a PEDOT layer 106 and a PPV layer 108 were deposited on each of the ITO coated substrates. In accordance with a particular preferred embodiment, a 20 nm thick PEDOT layer 106 and a 90 nm thick PPV layer 108 were each spin-coated onto each ta-C layer 114 using a conventional spin coater. Thereafter, a 5 nm thick Ca (99.5%) cathode 110, and a 200 nm thick silver (99.99%) protective layer 112 were deposited on each PPV layer 108 via thermal evaporation through a shadow mask, using an Edwards Auto 306 system at a pressure of $2.0 \times 10^{-6}$ Torr.

The six OLEDs 100 that were made using the above-described method each had an emitting area of about 2×2 mm$^2$. Each OLED 100 was tested to determine its current density, luminance, and current efficiency as a function of operating voltage, and to determine its luminance decay as a function of operating time at a constant current. The results of each of these tests is depicted graphically in FIGS. 3-6, respectively, and will now be described in more detail.

Figure 3:
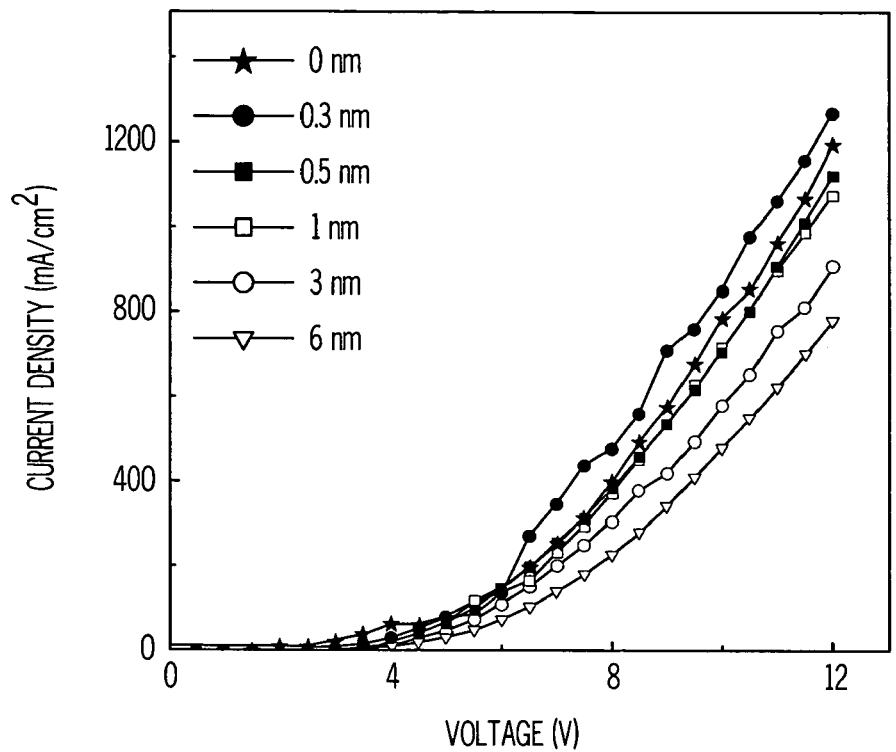
FIG. 3 is a graph illustrating the current density versus voltage characteristics for various OLEDs constructed similar to the one shown in FIG. 1.

With reference first to FIG. 3, it is seen that the threshold voltage for each of the OLEDs is substantially equivalent, and that the OLED having a ta-C layer thickness of 0.3 nm is the only OLED that has a higher current density than that of the standard OLED (i.e., the OLED without a ta-C layer). This indicates that the increased current injection for the OLED with the 0.3 nm thick ta-C layer is not due to tunneling. Rather, because an ultra-thin ta-C layer (e.g. ≦0.3 nm in thickness) is not continuous, it is believed that the increased current density exhibited by the 0.3 nm thick ta-C layer OLED is due to nano-structural interfaces formed between islands of ta-C on the ITO layer. It is further believed that these nano-structural interfaces inject a higher current density than a uniform ta-C/ITO interface. Thus, the OLEDs having a ta-C layer thickness of 0.5 nm or more, which are continuous and have uniform ta-C/ITO interfaces, have lower current densities than that of the standard OLED.

Figure 4:
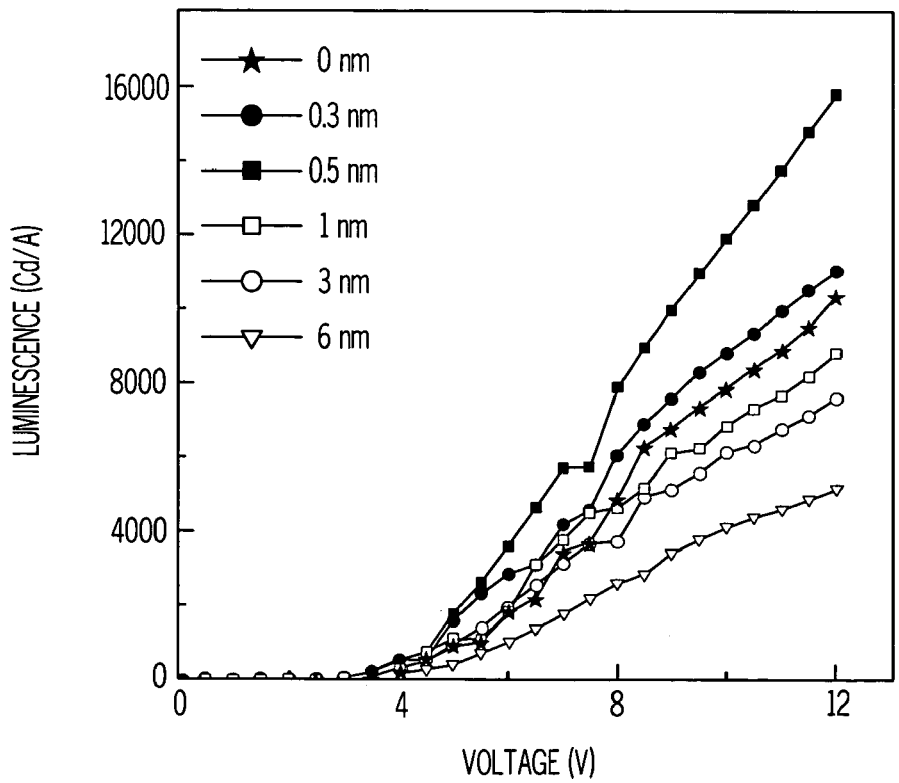
FIG. 4 is a graph illustrating the luminance versus voltage characteristics for various OLEDs constructed similar to the one shown in FIG. 1.

From the above description, and the graphical depiction in FIG. 3, it is seen that an ultra-thin ta-C layer (e.g., ≦0.3 nm) can enhance hole injection from the anode 102, whereas a somewhat thicker ta-C layer (e.g., ≧0.5 nm) can inhibit hole injection from the anode 102. Nonetheless, it is seen in FIG. 4 that the OLED having a 0.5 nm thick ta-C layer has a luminescence that is substantially higher than the OLED having a 0.3 nm thick ta-C layer. Moreover, even though FIG. 3 shows that the current vs. voltage characteristics for the OLEDs having 0.5 nm and 1.0 nm thick ta-C layers are substantially equivalent, FIG. 4 shows that the luminescence of the 0.5 nm thick ta-C OLED is significantly higher. As FIG. 4 also shows, the luminescence of the OLED decreases as the ta-C layer thickness increases above 1.0 nm. This is because as ta-C layer thickness increases, hole injection from the anode 104 is further inhibited and optical transparency is further decreased.

Figure 5:
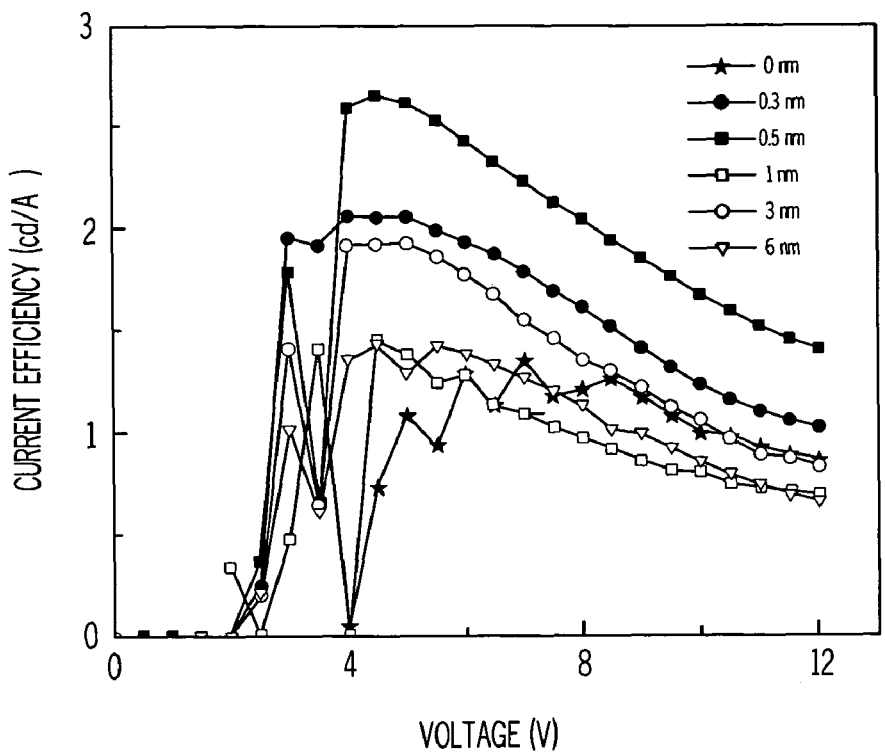
FIG. 5 is a graph illustrating the current efficiency versus voltage characteristics for various OLEDs constructed similar to the one shown in FIG. 1.

With reference now to FIG. 5, it is seen that the OLEDs with ta-C layer thicknesses of 0.3 nm, 0.5 nm, and 1.0 nm each have current efficiencies higher than that of the standard OLED, and that OLED with a 0.5 nm thick ta-C layer has the highest current efficiency. More specifically, the current efficiency of the standard OLED is 1.1 cd/A at 5.0 V, and the current efficiency of device with a 0.5 nm thick ta-C layer is 2.7 cd/A at 5.0 V, which is almost 2.5 times that of the standard OLED. Referring once again to FIGS. 3 and 4, the improvement in efficiency is due to the 0.5 nm thick ta-C layer inhibiting some hole transport from the anode 104, and thereby balancing the hole and electron current in the OLED.

Figure 6:
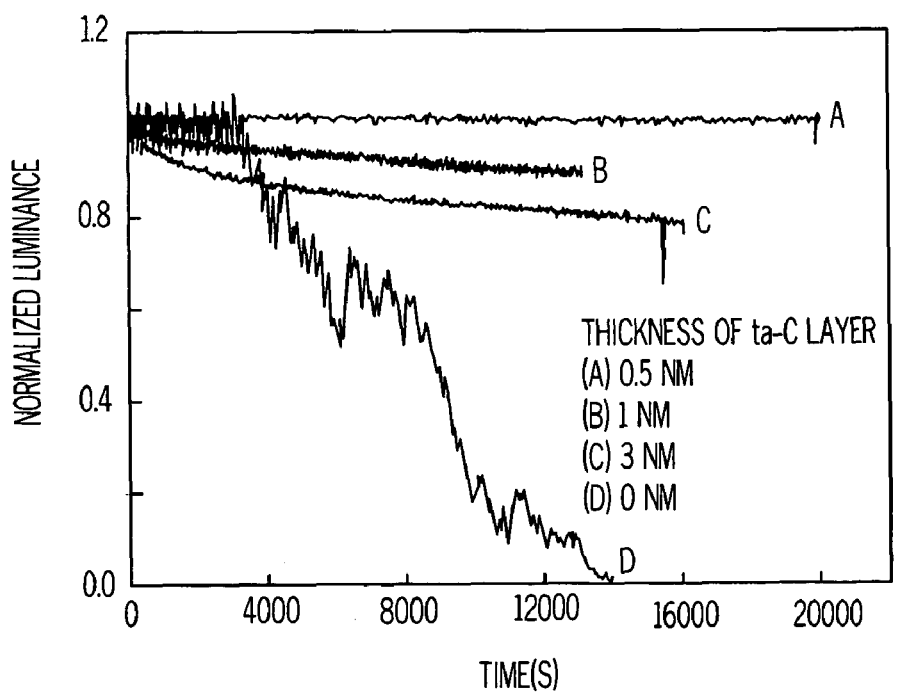
FIG. 6 is a graph illustrating the normalized luminance versus time characteristics for various OLEDs constructed similar to the one shown in FIG. 1.

The most significant improvement exhibited by the OLEDs with ta-C layers is in device stability. This is shown most clearly in FIG. 6, which graphically depicts luminance decay as a function of operating time at a constant current, for an initial luminance of about 105 cd/m$^2$. As is shown in FIG. 6, the standard OLED is completely destroyed after operating for about $1.4 \times 10^4$ seconds. However, the OLED with a 0.5 nm thick ta-C layer exhibits no significant luminance decay after operating for about $2 \times 10^5$ seconds, the OLED with a 1.0 nm thick ta-C layer decays about 10% of its initial luminance after operating for about $1.3 \times 10^4$ seconds, and the OLED with a 3.0 nm thick ta-C layer decays about 18% of its initial luminance after operating for $1.6 \times 10^4$ seconds.

The relatively fast luminance decay of the standard OLED is due, at least in part, to the surface roughness of the bare ITO layer 102 (see Table 1). The relatively sharp spikes on the surface of the ITO layer 104 lead to a non-uniform electric field and non-uniform hole injection. In particular, the electric field is much higher in the area of the spikes, which causes local high current density, resulting in localized overheating and the formation of dark spots. The dark spots continue to grow in number and size until the entire OLED emission area is consumed, and no emission is observed. Conversely, the OLEDs with a ta-C layer have relatively smoother surfaces, and thus have more uniform electric fields and current densities. Moreover, the ta-C layer prevents oxygen contamination from the ITO anode 104 to the organic layers 106, 108, and reduces hole injection from the ITO anode 104, both of which enhance OLED lifetime.

The OLED devices 100, 200 described herein include a relatively thin DLC layer 114 disposed between the anode 104 and the hole transport layer 106 to improve luminous efficiency and operating life time. The relatively thin DLC layer 114 inhibits hole injection, which balances charge flow and improves efficiency, and increases the surface smoothness of the anode 104, which contributes to the increased operating life time.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An organic light emitting diode, comprising:
    an anode;
    a diamond-like carbon (DLC) layer disposed on the anode, the DLC layer having a non-zero thickness less than 0.3 nm;
    an organic hole transport layer disposed on the DLC layer;
    an organic emission layer disposed on the hole transport layer; and
    a cathode disposed on the organic emission layer.

2. The OLED of claim 1, wherein the anode comprises indium-tin-oxide (ITO).

3. The OLED of claim 2, wherein the anode is about 60 nm in thickness.

4. The OLED of claim 1, wherein the anode comprises a material selected from the group consisting of indium-tin-oxide (ITO), metal doped zinc oxide (ZnO).

5. The OLED of claim 1, wherein the organic hole transport layer comprises polyethelen dioxy thiophene (PEDOT).

6. The OLED of claim 5, wherein the organic hole transport layer is about 20 nm in thickness.

7. The OLED of claim 1, wherein the organic hole transport layer comprises a water-soluble polymer.

8. The OLED of claim 1, wherein the organic emission layer comprises poly (p-phenylen vynelene) (PPV).

9. The OLED of claim 8, wherein the organic emission layer is about 90 nm in thickness.

10. The OLED of claim 1, wherein the organic emission layer is selected from the group consisting of poly (p-phenylen vynelene) (PPV) and polyfluorene (PFO) series materials.

11. The OLED of claim 1, wherein the cathode comprises calcium.

12. The OLED of claim 11, wherein the cathode is about 5 nm in thickness.

13. The OLED of claim 1, wherein the cathode is selected from the group consisting of calcium, lithium, natrium, kalium, Mg:Ag, Li:Al, Mg:Al, Ca:Ag, Ca:Al, Ba:Ag, and Ba—Al.

14. An organic light emitting diode, comprising:
    a substrate;
    an anode disposed on the substrate;
    a tetrahedral amorphous carbon (ta-C) layer disposed on the anode, the ta-C layer having a non-zero thickness less than 0.3 nm;
    an organic hole transport layer disposed on the ta-C layer;
    an organic emission layer disposed on the hole transport layer; and
    a cathode disposed on the organic emission layer.

15. The OLED of claim 14, wherein the anode comprises indium-tin-oxide (ITO).

16. The OLED of claim 15, wherein the anode is about 60 nm in thickness.

17. The OLED of claim 14, wherein the anode comprises a material selected from the group consisting of indium-tin-oxide (ITO), metal doped zinc oxide (ZnO).

18. The OLED of claim 14, wherein the organic hole transport layer comprises polyethelen dioxy thiophene (PEDOT).

19. The OLED of claim 18, wherein the organic hole transport layer is about 20 nm in thickness.

20. The OLED of claim 14, wherein the organic hole transport layer comprises a water-soluble polymer.

21. The OLED of claim 14, wherein the organic emission layer comprises poly (p-phenylen vynelene) (PPV).

22. The OLED of claim 21, wherein the organic emission layer is about 90 nm in thickness.

23. The OLED of claim 14, wherein the organic emission layer is selected from the group consisting of poly (p-phenylen vynelene) (PPV) and polyfluorene (PFO) series materials.

24. The OLED of claim 14, wherein the cathode comprises calcium.

25. The OLED of claim 24, wherein the cathode is about 5 nm in thickness.

26. The OLED of claim 14, wherein the cathode is selected from the group consisting of calcium, lithium, natrium, kalium, Mg:Ag, Li:Al, Mg:Al, Ca:Al, Ba-Ag, and Ba—Al.

* * * * *